United States Patent [19]

Patel

[11] 4,249,247
[45] Feb. 3, 1981

[54] REFRESH SYSTEM FOR DYNAMIC RAM MEMORY

[75] Inventor: Narendra M. Patel, San Antonio, Tex.

[73] Assignee: NCR Corporation, Dayton, Ohio

[21] Appl. No.: 1,983

[22] Filed: Jan. 8, 1979

[51] Int. Cl.³ .................... G11C 13/00; G06F 13/00
[52] U.S. Cl. .................... 364/900; 365/222
[58] Field of Search ............... 365/222, 228; 364/200 MS File, 900 MS File; 235/302.3; 307/238; 371/21

[56] References Cited

U.S. PATENT DOCUMENTS

| | | | |
|---|---|---|---|
| 3,748,651 | 7/1973 | Mesnik | 365/222 |
| 3,760,379 | 9/1973 | Nibby et al. | 365/222 |
| 3,859,638 | 1/1975 | Hume | 365/228 |
| 3,980,935 | 9/1976 | Worst | 365/228 |
| 4,006,468 | 2/1977 | Webster | 365/222 |
| 4,028,675 | 6/1977 | Frankenberg | 364/200 |
| 4,106,108 | 8/1978 | Cislaghi et al. | 365/222 |
| 4,133,051 | 1/1979 | Gentili | 365/222 |
| 4,142,233 | 2/1979 | Susuki | 364/200 |
| 4,158,883 | 6/1979 | Kadono et al. | 365/222 |
| 4,172,282 | 10/1979 | Aichelmann et al. | 365/222 |
| 4,185,323 | 1/1980 | Johnson et al. | 365/222 |

*Primary Examiner*—Mark E. Nusbaum
*Attorney, Agent, or Firm*—J. T. Cavender; Wilbert Hawk, Jr.; Richard W. Lavin

[57] ABSTRACT

A method and apparatus for controlling the refreshing of a volatile memory is disclosed in which conflicts between a memory refresh operation, the requirements for access to the memory during a data processing operation and a power up or power down condition are resolved. When a conflict occurs, clock signals are generated to provide a contention refresh operation of the memory with minimum interruption to normal access time between the control processor and the memory.

14 Claims, 9 Drawing Figures

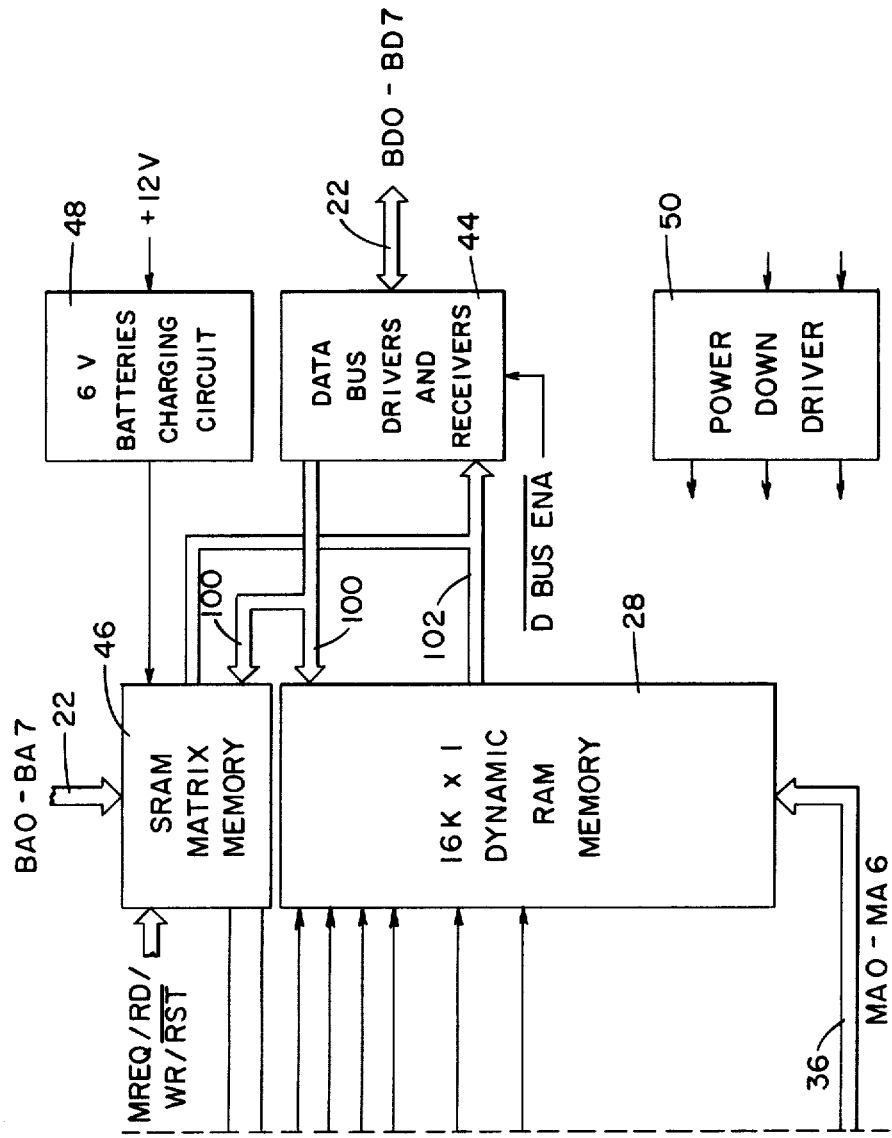

REFRESH SYSTEM FOR DYNAMIC RAM MEMORY

BACKGROUND OF THE INVENTION

The present invention relates to semiconductor memories and more particularly to control and timing logic circuits for supplying refresh pulses in a manner which does not interfere with the normal operation of the memory system. Dynamic memories are presently employed in data processing systems which employ charge-storing elements for storing data therein. This type of semiconductor memory has the advantage of high-speed access operation but has the disadvantage of having the charge leaking from the storing elements, thereby requiring that the charge be regenerated or refreshed so as not to lose the data represented by the charge level. In order to overcome this problem, prior art arrangements have been devised to provide refresh operations which are synchronized with the access operation of the memory systems so as to appear transparent to the central processor. But where there are other devices on line with the memory system which devices may interrupt the normal processing operation or where there is a power down of the memory system, it is necessary to insure that the data stored in the memory is not lost. It is therefore an object of this invention to provide an improved digital semiconductor memory system. It is a further object of the invention to provide a semiconductor memory system which includes circuit means for controlling the accessing and refreshing of the memory system while providing a minimum of interference between the access and refresh operations. It is another object of this invention to provide a memory system having improved access and refresh contention circuits which are composed of a relatively low number of digital elements and therefore, low in cost.

SUMMARY OF THE INVENTION

In order to fulfill these objects, there is disclosed a refresh control circuit which includes bi-stable devices operated to determine whether a refresh or a memory request operation should be initiated in accordance with the type of control signals received. A timing circuit will generate a refresh request signal periodically while a central processor generates memory request signals. Where both signals occur simultaneously, a contention refresh operation is initiated in which the central processor is put into a wait mode until the refresh operation is completed and a memory request operation is subsequently initiated. Where a memory request operation is in progress and a refresh operation is generated, the refresh operation will be initiated at the end of the memory request operation. Where a power down condition occurs during either a memory refresh or a memory request operation, battery-powered circuit means are provided which insure sufficient operating time for the refresh control circuit to complete a refresh operation or a memory request operation existing at the time of the power down occurrence.

BRIEF DESCRIPTION OF THE DRAWING

FIGS. 1A and 1B taken together constitute FIG. 1 and define a block diagram of the memory refresh control system;

DESCRIPTION OF THE PREFERRED EMBODIMENT

Figure 1A:
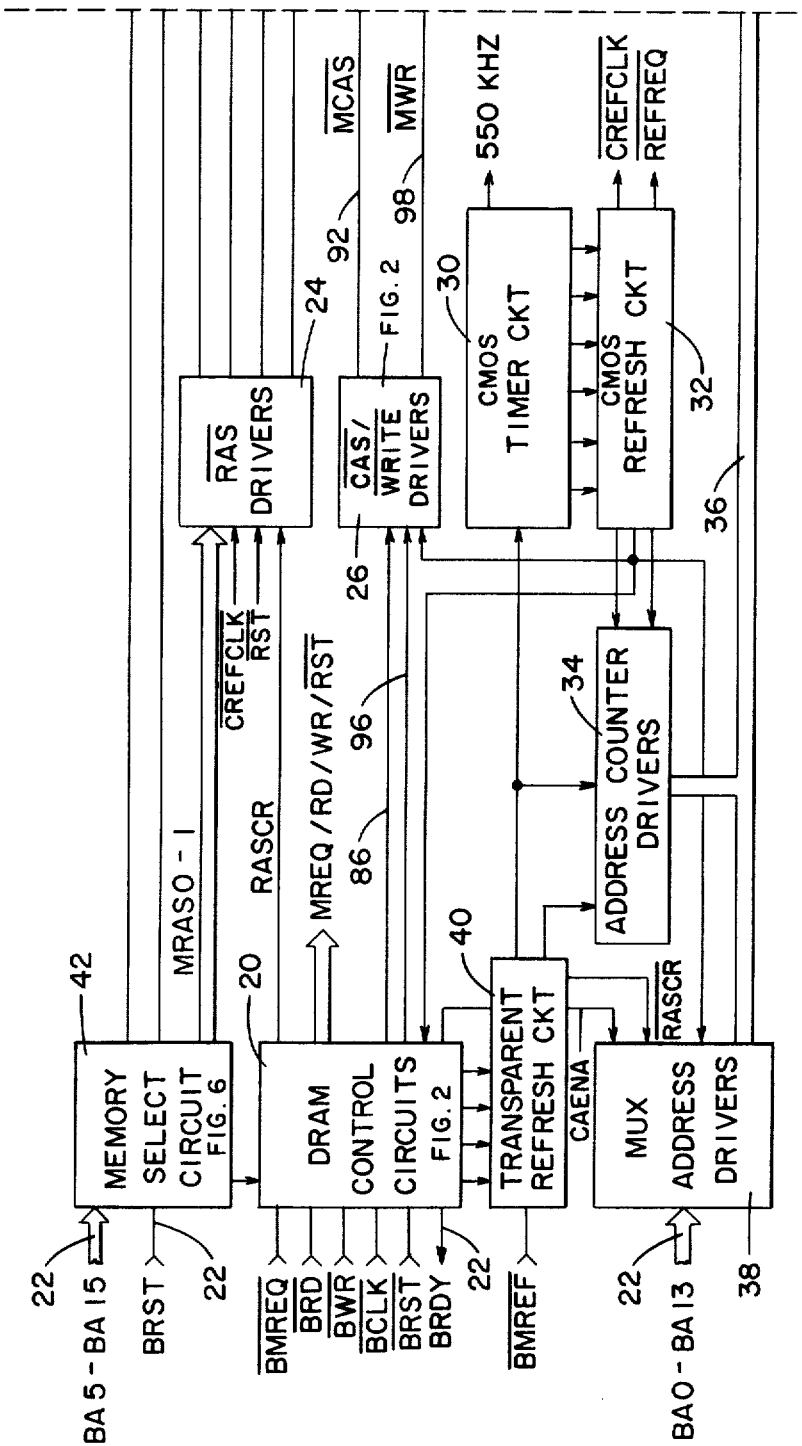

The memory refresh control system of the present embodiment is shown on FIG. 1 which includes a dynamic RAM (DRAM) control circuit 20 (FIG. 1A) coupled to a common bus over whose lines are transmitted from a central processing unit (CPU) well-known control signals for accessing a semiconductor memory such as a MOS dynamic random access memory. Included in these signals are a bus memory request $\overline{BMREQ}$ which signals the memory system that the processor is trying to access the memory, a bus read signal $\overline{BRD}$, a bus write signal $\overline{BWR}$, a system clock BCLK, a bus reset $\overline{BRST}$ and a signal BRDY generated in the control circuits 20 for transmission over the bus to the CPU putting the CPU into a wait mode. The DRAM control circuits 20 generate the appropriate control signals for transmission to the row address strobe $\overline{RAS}$ driver 24 and the column address strobe $\overline{CAS}$ driver 26, each of which outputs the appropriate strobe signal to a 16K RAM memory 28 (FIG. 1B) enabling the memory to be accessed. An example of such a memory that is commercially available is the MOSTEK MK411GP-⅜ RAM memory manufactured by the Mostek Corporation of Carrollton, Tex.

Further included in the control system is a CMOS timer circuit 30 (FIG. 1A) which outputs control signals after a predetermined time period to a CMOS refresh circuit 32 to initiate a refresh operation of the RAM memory 28. In the present embodiment, the timer circuit 30 will output the necessary control signals to the refresh circuit 32 every 27 microseconds. The refresh circuit 32 in response to receiving the control signals will generate the refresh clock $\overline{CREFCLK}$ used in initiating a refresh operation. The operation of the timer circuit 30 is asynchronous with the operation of the memory system. Associated with the refresh circuit 32 is an address counter driver 34 (FIG. 1A) which, when enabled by operation of the refresh circuit 32, will output 128 counts for use in the addressing of the column structure in the RAM memory 28 (FIG. 1B). The RAM memory 28 is a 128×128 cell matrix, the operation of which requires strobe signals to occur in both 128 rows and columns in a manner that is well known in the art.

The output of the address counter drivers 34 is transmitted over bus 36 to a multiplex address driver 38 which also receives the address bits BA0–BA13 of the data to be accessed over the common bus 22 from the CPU. The selection of the address that is to be transmitted from the multiplexer 38 to the RAM memory 28 is controlled by a transparent refresh circuit 40 which determines the priority between a refresh operation and a memory request operation when they occur simultaneously. Other circuits in the memory system of FIG. 1 include memory select circuits 42 (FIG. 1A) for generating the row address strobes $\overline{\text{RAS}}$ during either a memory request operation or a memory refresh operation, data bus drivers and receivers 44 (FIG. 1B) for outputting data over the common bus 22 to the CPU as the result of a read operation and for receiving data to be written into the RAM memory 28 as a result of a write operation, a static RAM matrix memory SRAM 46 (FIG. 1B) which is nonvolatile in its construction for storing data which is to be retained by the system, a battery-supported charging system 48 (FIG. 1B) for supporting the operation of the SRAM matrix memory 46 and a battery supported power down voltage driver 50 (FIG. 1B) for outputting a plurality of voltage signals to the memory select circuit 42, the voltage signals supporting a refresh operation or an access operation of the memory system when the RAM memory 28 is involved in a power down condition wherein all power is lost to the memory system.

Figure 2:
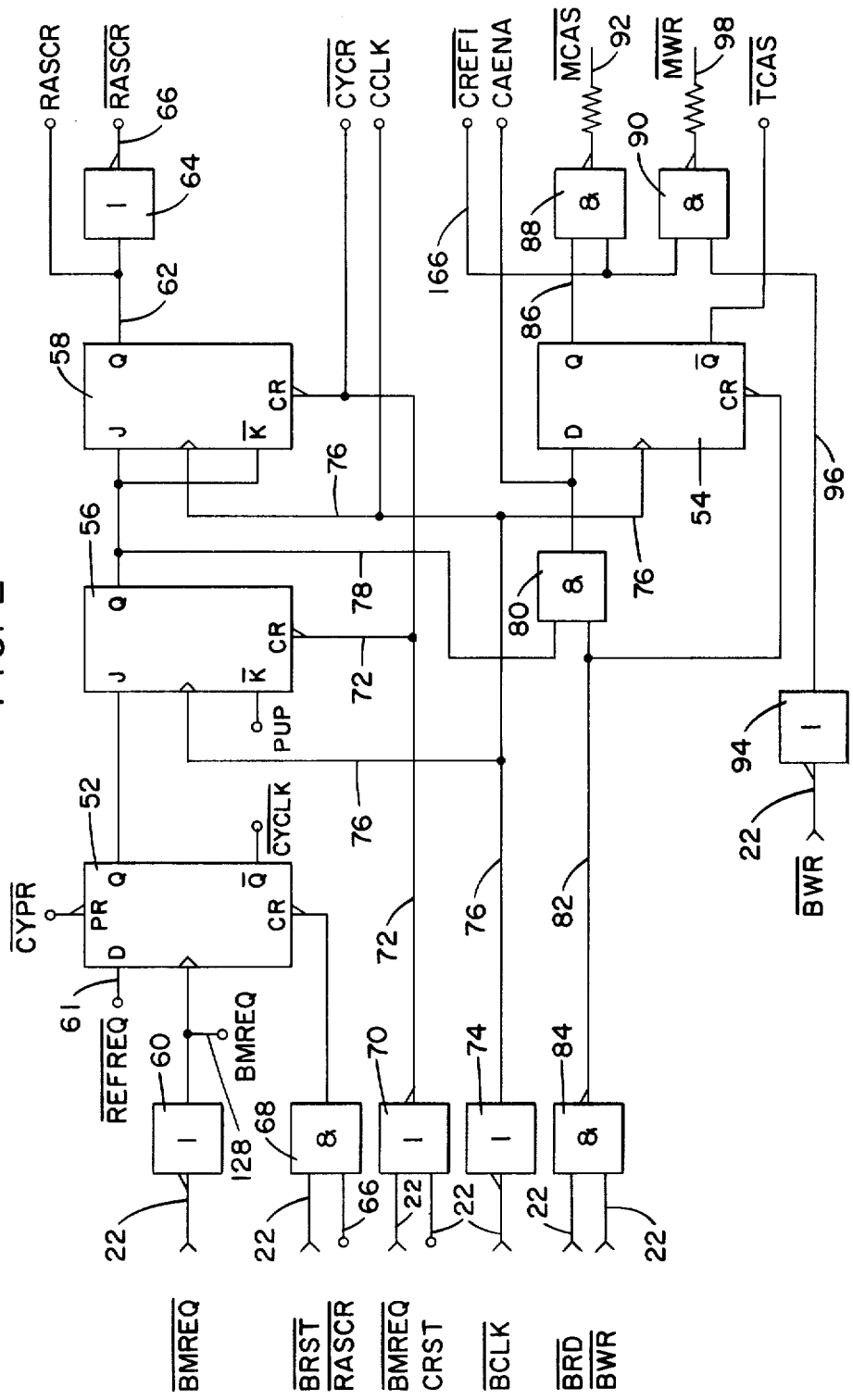
FIG. 2 is a detailed schematic diagram of the logic circuit for controlling whether a memory request or a memory refresh operation is to occur.

Referring now to FIG. 2, there is shown a schematic diagram of a memory interface circuit which controls the type of operation that is to be initiated in the memory system, which may include a memory request operation or a memory refresh operation. This circuit is located in the DRAM control circuit 20 (FIG. 1A) and the transparent refresh circuit 40 (FIG. 1A). Included in the circuits are a pair of D-type flip-flops 52 and 54 which may be part no. LS74 manufactured by Texas Instruments, Inc. Hereinafter, certain of the logical elements disclosed in the circuits described will be identified by their part numbers, which are manufactured by a number of companies, such as Texas Instruments, Inc., for example. If the designation refers to a manufacturer other than Texas Instruments, Inc., the manufacturer of the part will be identified. The signals are illustrated in the accompanying drawings in their active state.

Figure 7:
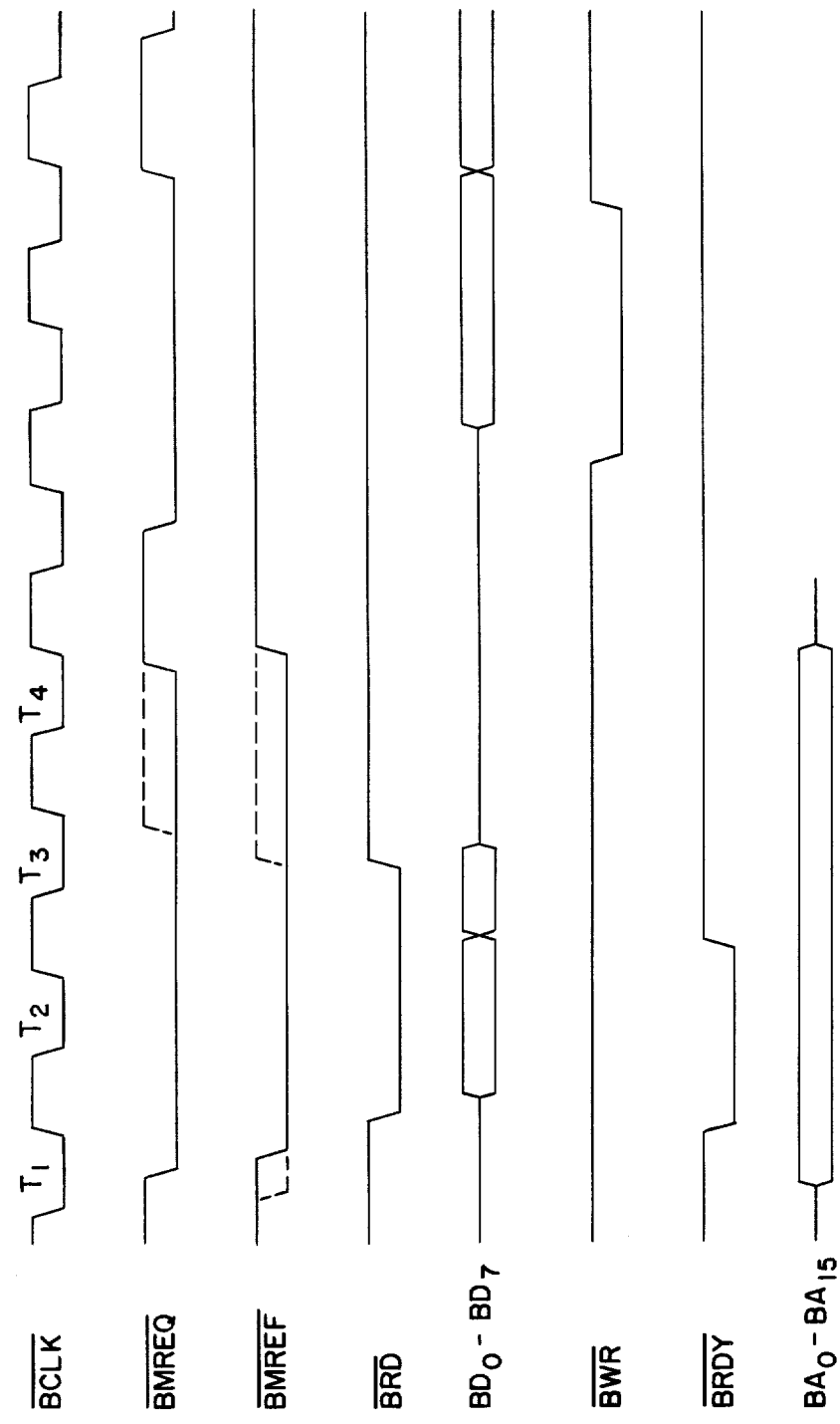
FIG. 7 is a timing diagram of the control signals for accessing the memory system during a memory request operation.

Also included in the circuit of FIG. 2 are a pair of SN54LS109 J-K flip-flops 56 and 58. Coupled to the clock input of the flip-flop 52 through an inverter 60 is the bus memory request signal $\overline{\text{BMREQ}}$ transmitted from the CPU over the common bus line 22 notifying the memory system of a memory access operation. The D input of flip-flop 52 is coupled over line 61 to the refresh circuit 32 (FIG. 1A) over which is transmitted the bus memory refresh signal $\overline{\text{REFREQ}}$ (FIG. 5) which is active low when a refresh operation is requested as a result of the operation of the timer circuit 30. If at this time the signal $\overline{\text{BMREQ}}$ is low, indicating a memory request operation, the clocking of the flip-flop 52 by the signal $\overline{\text{BMREQ}}$ going from low to high will result in a high signal appearing at the J input of flip-flop 56 and subsequently the Q output signal row address strobe clear RASCR of flip-flop 58 will go high, thereby becoming active. The signal RASCR is also transmitted over line 62 through an inverter 64 to produce the active low signal $\overline{\text{RASCR}}$ which is transmitted over line 66 to one input of AND gate 68 (FIG. 2), thereby disabling the AND gate 68 from clearing the flip-flop 52 until the signal RASCR goes high. This latter condition occurs when the signal $\overline{\text{BMREQ}}$ goes high at the end of a memory access operation. The signal $\overline{\text{BMREQ}}$ going high also resets the flip-flop 56 and 58 due to the high signal appearing on the output of the NOR gate 70, which signal is transmitted over line 72 to the clear inputs of the flip-flops 56 and 58. The NOR gate 70 receives the $\overline{\text{BMREQ}}$ signal and a power on reset signal BRST which becomes active high at the start of a power on condition as will be described more fully hereinafter. The flip-flops 54–58 inclusive (FIG. 2) are clocked by the bus clock $\overline{\text{BCLK}}$ transmitted through the inverter 74 resulting in the inverted signal being transmitted over line 76 to the flip-flops. As shown in FIG. 7, the clock signal $\overline{\text{BCLK}}$ synchronizes the operation of the flip-flops 52–58 inclusive with the generation of the bus signals $\overline{\text{BMREQ}}$, $\overline{\text{BWR}}$ and $\overline{\text{BRD}}$ used in accessing the RAM memory 28 (FIG. 1B) for a read or write operation in a manner that is well-known in the art.

Setting of the flip-flop 56 as the result of the clocking of flip-flop 52 results in the presence of a high signal at the Q output which signal is transmitted over line 78 to the AND gate 80 whose other input is coupled over line 82 to the NAND gate 84 which outputs a high signal when either the bus read signal $\overline{\text{BRD}}$ or the bus write signal $\overline{\text{BWR}}$ is active low indicating the type of access that is being requested by the CPU.

Assuming for purposes of illustration that the CPU is requesting a write and access operation, the active low signal $\overline{\text{BWR}}$ enables the AND gate 80 to output a high signal to the D input of the J-K flip-flop 54 whose Q output will go high and its $\overline{\text{Q}}$ output will go low. The Q output signal is transmitted over line 86 to the CAS-WRITE drivers 26 (FIG. 1A) which circuits include the NAND gate 88 (FIG. 2) whose output signal memory column address strobe $\overline{\text{MCAS}}$ is transmitted over line 92 to the RAM memory 28 (FIG. 1B). As is well-known in the art, the signal $\overline{\text{MCAS}}$ is used for clocking into the column section of the RAM memory 28 the address bits BA0–BA13 transmitted from the multiplexer address drivers 38 (FIG. 1A) over bus 36 for accessing the memory. The RAM memory 28 is enabled by the cycle clock signal $\overline{\text{CYCLK}}$ (FIG. 2) which appears on the $\overline{\text{Q}}$ output of flip-flop 52 and which is active low when the flip-flop 52 is set at the start of a memory request operation.

The bus write signal $\overline{\text{BWR}}$ is also transmitted over the bus line 22 to an inverter 94 (FIG. 2) whose high output signal is transmitted over line 96 to one input of the NAND gate 90. The other input of both NAND gates 88 and 90 (FIG. 2) will have present thereon the high inactive CMOS refresh signal $\overline{\text{CREF1}}$ (FIG. 5), allowing the NAND gate 90 to output the active low memory write signal $\overline{\text{MWR}}$ over line 98 to the RAM memory 28 (FIG. 1B) enabling a write operation to occur. Other signals being transmitted to the RAM memory 28 include the column address enable signal CAENA which appears on the output of the AND gate 80 (FIG. 2) and which controls the switching of the address bits BA0–BA13 from the row portion of the RAM memory to the column portion of the memory in a manner that is well-known in the art. The setting of the flip-flop 54 (FIG. 2) produces on its $\overline{\text{Q}}$ output an internal column address strobe $\overline{\text{TCAS}}$ used in addressing the RAM memory 28.

If the bus write signal $\overline{BWR}$ is active, the data bus driver and receiver circuit 44 (FIG. 1B) will input the data bits BD0–BD7 inclusive into the RAM memory 28 and the SRAM matrix memory 46 if required, the data bits being transmitted over bus 100 (FIG. 1B). Likewise, if a read operation is to occur, the bus read signal $\overline{BRD}$ will be active low, thereby setting the flip-flop 54 in the manner described above and enables the NAND gate 88 to output the active low signal $\overline{MCAS}$. The data bits BD0–BD7 will be outputted from the RAM memory 28 and the matrix memory 46 over bus 102 (FIG. 1B) through the driver circuits 44 and over the common bus 22 to the CPU under the control of a data bus enable signal $\overline{D\ BUS\ ENA}$ generated in the control circuits 28 (FIG. 1A).

If at the time the signal $\overline{BMREQ}$ (FIG. 2) goes low, the refresh request signal $\overline{REFREQ}$ appearing on line 61 is low, the flip-flop 52 will remain in a reset condition allowing a refresh operation to occur. At the end of the refresh operation, a cycle preset signal $\overline{CYPR}$ (FIG. 4) is generated in a manner to be described hereinafter which presets the flip-flop 52. If the signal $\overline{BMREQ}$ is low at this time indicating that a memory request operation is still to occur, the flip-flop 52 will be set, thereby initiating a memory request operation in the manner described above.

Figure 3:
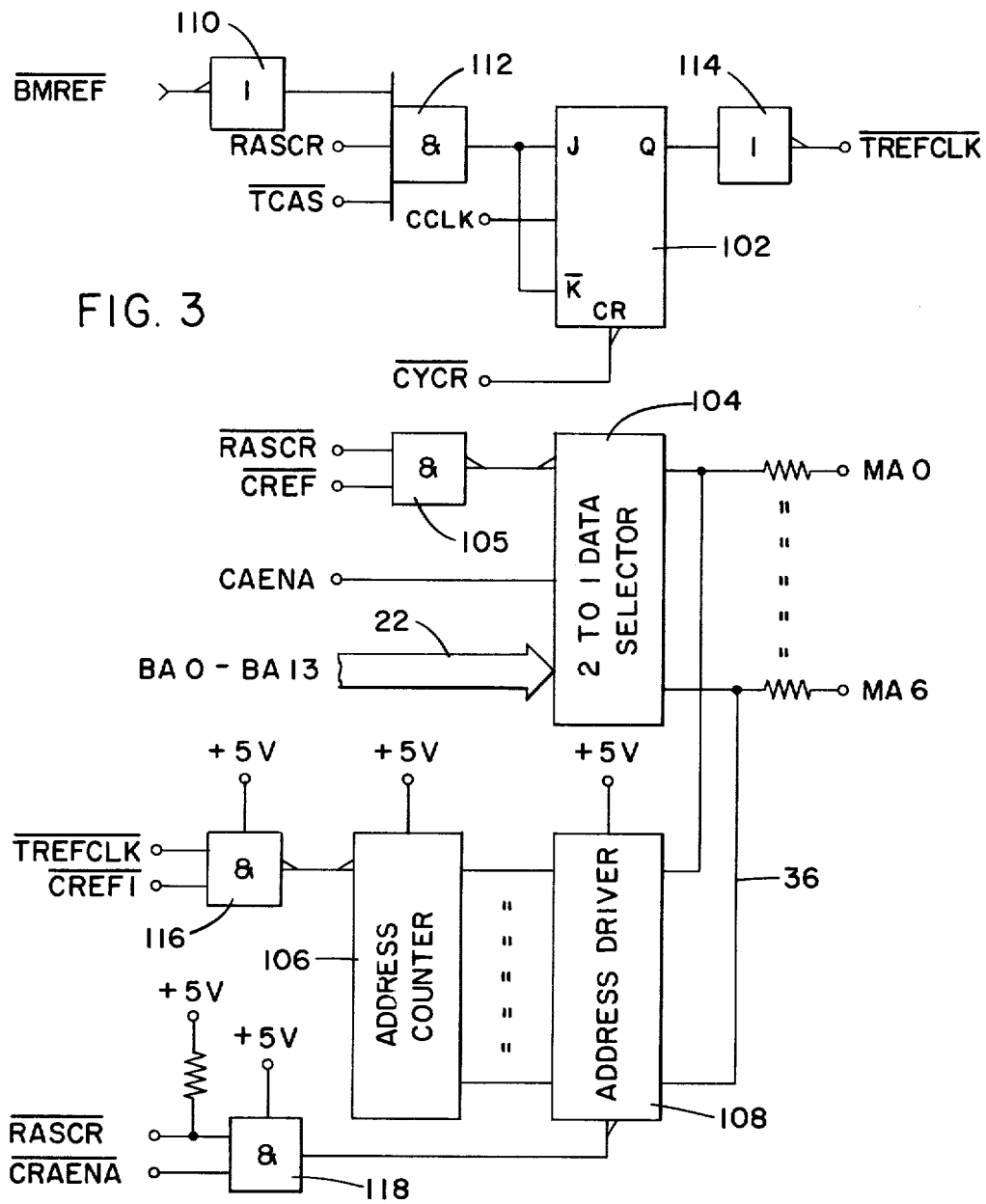
FIG. 3 is a detailed schematic diagram of the logic circuits for providing a transparent refresh clock which enables the row address strobe signals to perform a refresh operation.

Referring now to FIG. 3, there is shown the circuitry for performing a transparent refresh operation of the RAM memory 78 (FIG. 1B) in response to the generation of a system refresh signal $\overline{BMREF}$ (FIG. 1A) by the CPU. Included in the circuit is a SN54LS109 J-K flip-flop 102 which is located in the transparent refresh circuit 40 (FIG. 1A) and a two-to-one data selector 104 which may be a SN54LS157 multiplexer available from Texas Instruments, Inc. The data selector 104 is located in the multiplexer address drivers 38 (FIG. 1A). Also included in the circuit is a SN54LS393 address counter 106 and a SN54LS196 address driver 108 located in the address counter driver circuit 34 (FIG. 1A). The system will output an active low bus memory refresh signal $\overline{BMREF}$ every four-five microseconds during a normal access operation. The active low signal $\overline{BMREF}$ is transmitted through an inverter 110 (FIG. 3) to one input of an AND gate 112 (FIG. 3) whose other input includes the signal RASCR generated from the Q output of flip-flop 54 (FIG. 2) and the signal $\overline{TCAS}$ which is the $\overline{Q}$ output of flip-flop 86 (FIG. 2). Upon the signal $\overline{BMREF}$ going low, the AND gate 112 is conditioned to output a high signal upon both the signals RASCR and $\overline{TCAS}$ going high. This latter condition occurs at the end of a memory request operation, thereby allowing the refresh operation to occur at the end of the memory request operation. It will be appreciated that this allows the refresh operation to be transparent to the system.

The outputting of a high signal from the AND gate 112 will set the J-K flip-flop 102 producing at its Q output a high signal which becomes the active low transparent refresh clock signal $\overline{TRESCLK}$ after being inverted by the inverter 114. The flip-flop 102 is clocked by the clock signal CCLK which appears on the output of the inverter 74 (FIG. 2). Also inputted into the clear input of the flip-flop 102 is the cycle clear signal $\overline{CYCR}$ which is generated on the output of the NOR gate 70 (FIG. 2) and which becomes active low when a system reset signal BRST becomes active high.

The transparent refresh clock signal $\overline{TRECLK}$ is transmitted to one input of the NAND gate 116 (FIG. 3) whose other input signal $\overline{CREF}$ (FIG. 5) is active low at this time, thereby resulting in the NAND gate 116 outputting a high signal which enables the address counter 106 to output counts 0–127 to the address driver 108 which in turn outputs the counts over bus line 36 and the memory address lines MA0–MA7 for refreshing 128 rows in the RAM memory 28 in a manner that is well-known in the art.

During the memory request operation, the signals $\overline{RASCR}$, $\overline{CREF}$ and $\overline{CAENA}$ (FIG. 2) will be active low, thereby enabling the data selector 104 to output over the memory address lines MA0–MA6 the address bits BA0–BA13 appearing on the bus line 22 to the RAM memory 28. Upon the completion of the memory request operation, the data selector 104 is disabled by the above signals as described previously. The active low signals $\overline{RASCR}$ and $\overline{CAENA}$ will enable the AND gate 118 (FIG. 3) to output a low signal which disables the operation of the address driver 108. Both the data selector 104 and the address driver 108 are tri-state devices which will float when disabled.

Figure 4:
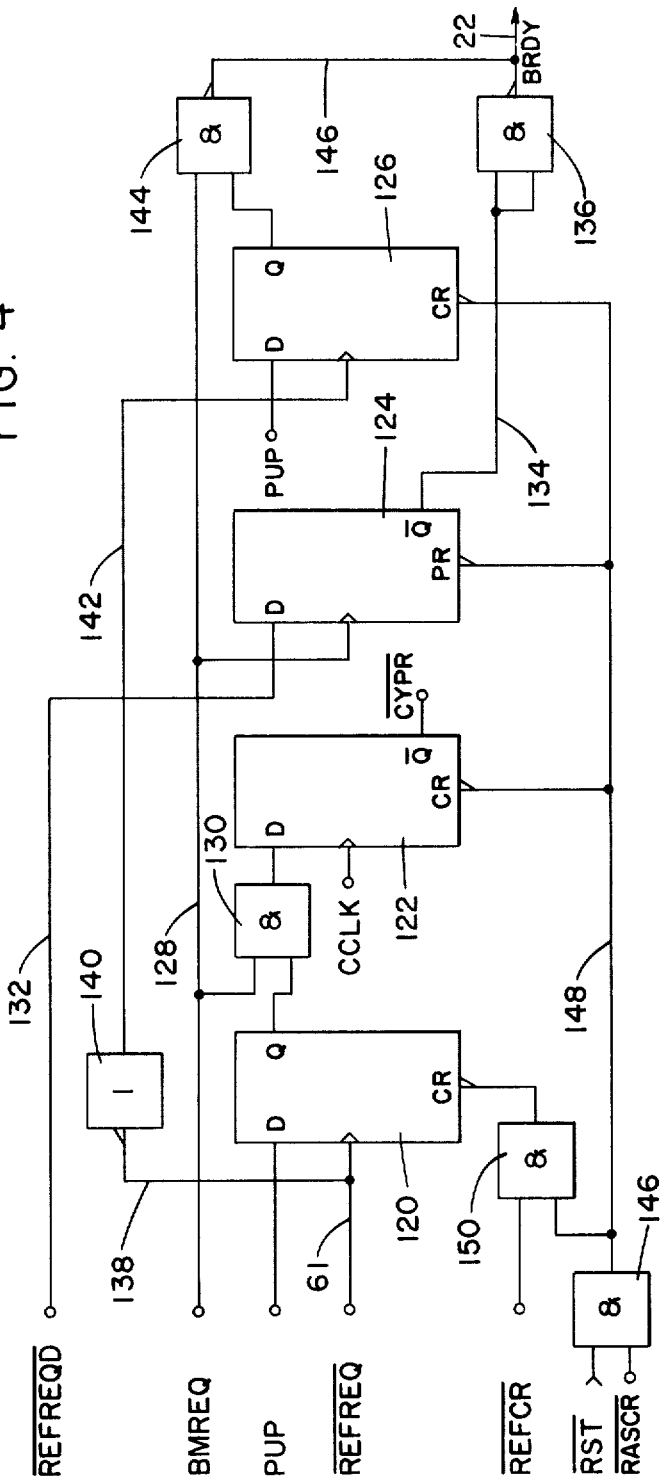
FIG. 4 is a detailed schematic diagram of the logic circuitry for controlling the contention refresh operation where a memory request signal and a memory refresh signal occur at the same time.

Referring now to FIG. 4, there is shown circuitry for disabling the CPU during a contention refresh operation when both a memory request signal and a contention refresh signal generated as a result of the operation of the timer circuit 30 (FIG. 1A) occur simultaneously. When this condition occurs, the refresh operation is given priority. Included in this circuit are four LS74 D-type flip-flops 120–126. Upon the timer circuit 30 (FIG. 1A) outputting the refresh request signal $\overline{REFREQ}$ (FIG. 5) in a manner that will be described more fully hereinafter, a refresh operation occurs which requires that the CPU be put into a wait mode until the coexisting memory request operation is carried out. When the CPU is transmitting a memory request instruction, the bus memory request signal BMREQ (FIG. 4) will be high, which signal is transmitted over line 128 from the output of the inverter 60 (FIG. 2) to one input of the AND gate 130. The other input of the AND gate 130 is coupled to the Q output of the flip-flop 120 which becomes high at the time of completing the previous refresh cycle by the presence of the pull-up signal PUP being high. These signals enable the AND gate 130 to output a high signal to the D input of the flip-flop 122 thereby setting the flip-flop on the rising edge of the next clock signal CCLK (FIG. 2). The setting of the flip-flop 122 will output the preset signal $\overline{CYPR}$ which is transmitted to the flip-flop 52 (FIG. 2) presetting the flip-flop. If at this time the bus memory request signal $\overline{BMREQ}$ (FIG. 2) is still active low indicating that a memory request is still pending, the presetting of the flip-flop 52 will initiate a memory request cycle in the manner described previously.

As will be described more fully hereinafter, the signal $\overline{REFREQD}$ (FIGS. 4 and 5) is generated 50 nanoseconds after the generation of the signal REFREQ. The active low signal $\overline{REFREQD}$ (FIG. 4) is transmitted over line 132 to the D input of flip-flop 124 setting the flip-flop thereby producing a low signal on its $\overline{Q}$ output, which signal is transmitted over line 134 to the NAND gate 136 whose output signal BRDY will become active high. This signal is transmitted over the bus line 22 to the CPU indicating that the RAM memory 28 (FIG. 1B) is ready for access. This condition addresses a problem generated when the memory request signal is raised after a refresh cycle has been initiated or where both cycles are generated simultaneously and priority has been given to the refresh cycle. Since the CPU has no way of knowing that such a condition is in existence, the CPU must be put into a wait mode until the memory refresh cycle is completed.

Figure 8:
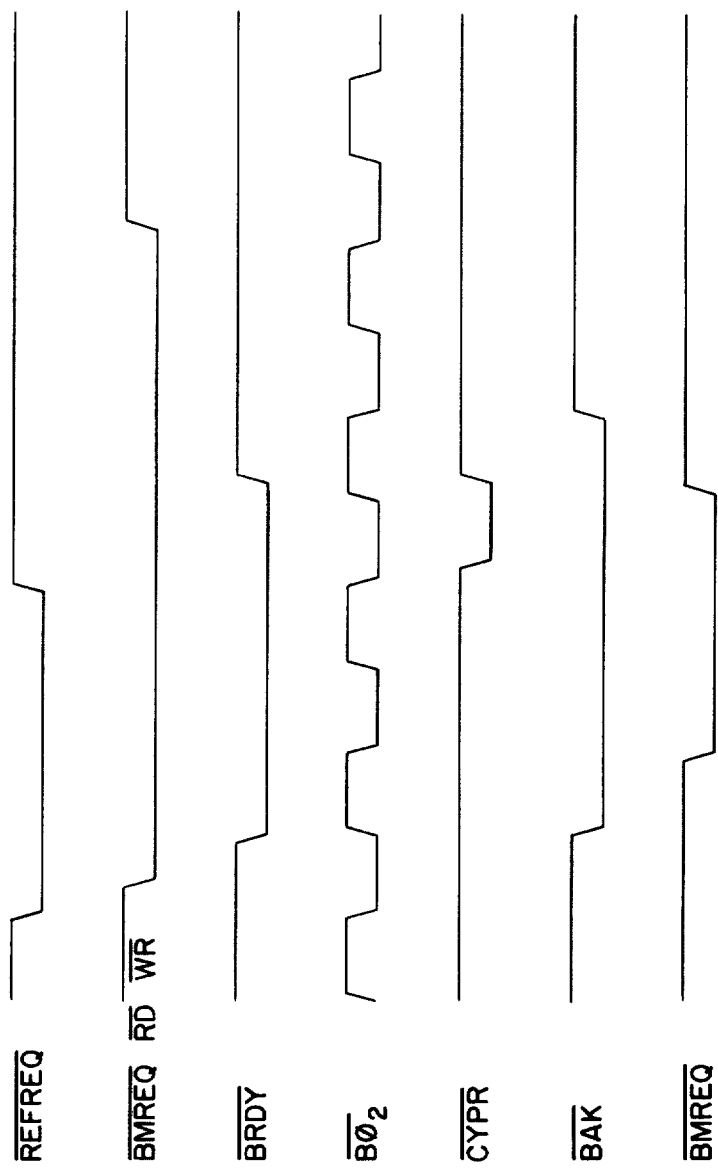
FIG. 8 is a timing diagram of the control signals generated during a contention refresh operation.

To put the CPU into a wait mode, the signal BRDY must go low. This is accomplished when the refresh signal $\overline{REFREQ}$ (FIG. 4) becomes active low (FIG. 8), which signal is transmitted over line 138 to the inverter 140. The inverter 140 will output a high signal over line 142 to the clock input of the flip-flop 126 setting the flip-flop which results in the Q output of the flip-flop going high because of the high signal PUP being present at the D input of the flip-flop. The Q output signal of the flip-flop 126 is applied to one input of the AND gate 144 whose other input receives the memory request signal $\overline{BMREQ}$ which becomes high when a memory request signal is generated by the CPU. When this condition occurs, the AND gate 144 will output the low signal $\overline{BRDY}$ (FIG. 8) over line 146 and the bus 22. At the end of the refresh cycle, the signal $\overline{REFREQ}$ will go high which raises the signal $\overline{BRDY}$ allowing the CPU to complete the memory request cycle.

Figure 5:
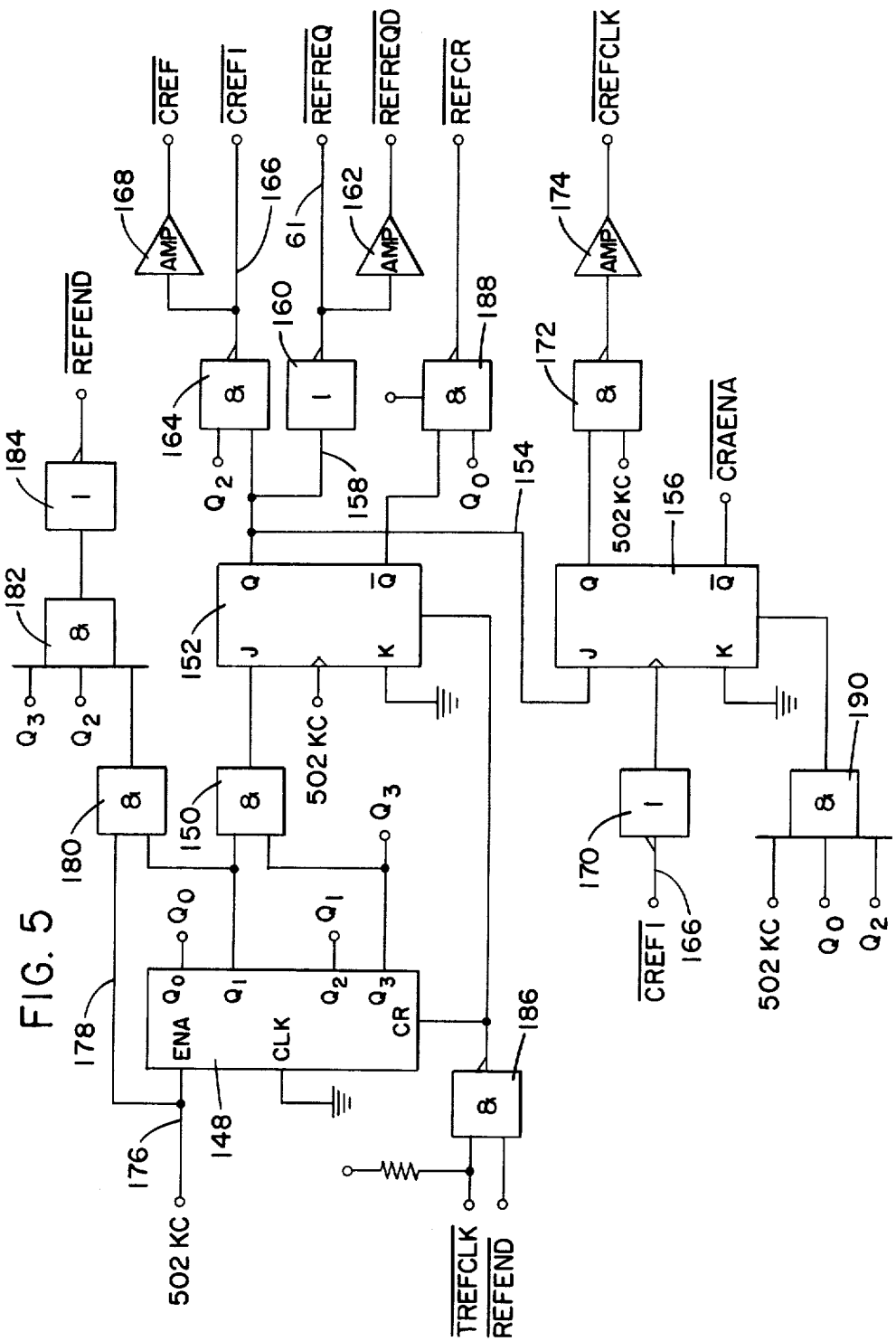
FIG. 5 is a detailed schematic diagram of the logic circuitry for generating the refresh cycle of the memory system.

Referring now to FIG. 5, there is shown details of the timer circuit 30 and the refresh circuit 32 (FIG. 1A) which provides the control signals for carrying out a contention refresh operation. Included in the circuit is a MC14520 binary counter 148 manufactured by Motorola, Inc. of Phoenix, Ariz., which is operated by a 502 kilocycle clock generator located in an oscillator (not shown) located in the timer circuit 30 (FIG. 1A). When enabled, the counter 148 will output a binary count for a period of 27 microseconds, the count appearing on the outputs of $Q_0$–$Q_3$ inclusive. At the end of the 27 microsecond period, the output signals appearing on the outputs $Q_1$ and $Q_3$ will be high, which signals when applied to the AND gate 150 will enable the AND gate to output a high signal to the J input of a MC4027 J-K flip-flop 152 setting the flip-flop. The Q output signal of flip-flop 152 will go high upon the setting of the flip-flop which signal is transmitted over line 154 to the J input of a second MC4027 J-K flip-flop 156, thereby setting the flip-flop 156. Both flip-flops 152 and 156 are manufactured by Motorola, Inc.

The setting of the flip-flop 152 at the end of the 27 microsecond time period initiates a refresh cycle request in a manner that will now be described. The high Q output signal of flip-flop 152 is transmitted over line 158 to the inverter 160 whose active low refresh request signal $\overline{REFREQ}$ is transmitted over line 61 to the D input of flip-flop 52 (FIG. 2) disabling the flip-flop from initiating a memory request cycle in the manner described previously. The $\overline{REFREQ}$ signal is also clocked into the flip-flop 120 (FIG. 4) thereby conditioning the AND gate 130 to control the generation of the cycle preset signal $\overline{CYPR}$ for presetting the flip-flop 52 at the end of the refresh cycle if there is present an active low memory request signal $\overline{BMREQ}$ as described previously.

The output signal $\overline{REFREQ}$ of the inverter 160 (FIG. 5) is also transmitted to an amplifier 162 whose delayed output signal $\overline{REFREQD}$ sets the flip-flop 124 (FIG. 4) resulting in the signal $\overline{BRDY}$ appearing on the $\overline{Q}$ output going high, notifying the CPU that the RAM memory 28 (FIG. 1B) is available for access at this time.

The Q output signal of flip-flop 152 is also transmitted to one input of an AND gate 164 whose output contention refresh signal $\overline{CREFI}$ will become active low when the binary pulses appearing on the $Q_2$ output of the counter 140 becomes high. The active low signal $\overline{CREFI}$ is transmitted over line 166 (FIG. 5) through the amplifier 168 to produce a delayed active low contention refresh signal $\overline{CREF}$, which signal is transmitted to one input of the NAND gate 105 (FIG. 3) enabling the gate to output a high signal, this condition occurring during a memory request operation. It will be appreciated that the output signal of the NAND gate 105 (FIG. 3) controls whether the address bits transmitted over the bus 36 will comprise the output of the address counter 106 (FIG. 3) which is required during a refresh cycle or the address bits BA0–BA13 appearing on the bus 22 and which is required for a memory request cycle. When the gate 105 (FIG. 3) outputs a high signal, the data selector 104 is disabled from transmitting the address bits BA0–BA13 over the input lines MA0–MA6 of bus 36 to the RAM memory 28 (FIG. 1B) thereby enabling a refresh operation to occur in the manner described previously.

The contention refresh signal $\overline{CREFI}$ (FIG. 5) is transmitted to NAND gate 116 (FIG. 3) enabling the gate to output a high enabling pulse if either of the input signals $\overline{CREFI}$ or $\overline{TREFCLK}$ is active low. The active high output pulse of gate 116 enables the address counter 106 to output the 128 counts from the bus counter 106 which are used in refreshing the RAM memory 28 (FIG. 1A) in a manner that is well-known in the art. The contention refresh signal $\overline{CREFI}$ is further transmitted over line 166 to one input of NAND gates 88 and 90 (FIG. 2) disabling the NAND gates 88 and 90 thereby preventing the occurrence of a memory write cycle during a refresh cycle. The signal $\overline{CREFI}$ is also transmitted over line 166 through an inverter 170 (FIG. 5) whose output signal will clock the flip-flop 156. The setting of the flip-flop 156 will produce at its Q output a high signal which is transmitted through a NAND gate 172 by the 502 kilocycle clock resulting in the output signal contention refresh clock $\overline{CREFCLK}$ being transmitted through an amplifier 174 to the memory select circuits 42 (FIGS. 1 and 6) for selecting certain circuits for a refresh operation as will be described hereinafter. The setting of the flip-flop 156 (FIG. 5) will also produce at its $\overline{Q}$ output the active low contention refresh enable strobe signal $\overline{CRAENA}$, which signal is coupled to the AND gate 118 (FIG. 3) thereby enabling the gate to output a high signal to the address driver 108 enabling the driver to output the counts transmitted from the address counter 106 over bus 36 during a refresh operation in the manner described previously.

The 502 kilocycle clock pulse signal appearing on the input line 176 (FIG. 5) of the counter 148 is also transmitted over line 178 to one input of the AND gate 180 whose other input is connected to the $Q_1$ output of the counter 148. During the 27 microsecond output count, the AND gate 180 will output a high signal to one input of an AND gate 182 whose other inputs are connected to the $Q_2$ and $Q_3$ output of counter 148. At the end of a refresh cycle which occurs from four nanoseconds after the 27 microsecond time period has elapsed, the AND gate 182 will be enabled by the high signals $Q_2$ and $Q_3$ to output a high signal to an inverter 184 whose active low output refresh end signal $\overline{REFEND}$ is transmitted to a NAND gate 186 (FIG. 5) enabling the gate to output a high signal. The high output signal of NAND gate 186 will reset the counter 148 and the flip-flop 152, thereby allowing the counter to start another 27 microsecond counting period. The other input signal $\overline{TREFCLK}$ appearing at the AND gate 186 will become active low during a transparent refresh cycle, thereby resetting the timer 148. It will thus be seen that during a normal request operation by the CPU, the timer 148 will be reset during a transparent refresh operation.

The resetting of the flip-flop 152 (FIG. 5) will also produce on its Q output a high signal which is transmitted to a NAND gate 188 (FIG. 5) enabling the gate to output an active low refresh clear signal $\overline{REFCR}$ which signal will reset the flip-flop 120 (FIG. 4). The timing out of the counter 148 will also enable an AND gate 190 (FIG. 5) to output a high signal for resetting the flip-flop 156.

Figure 6:
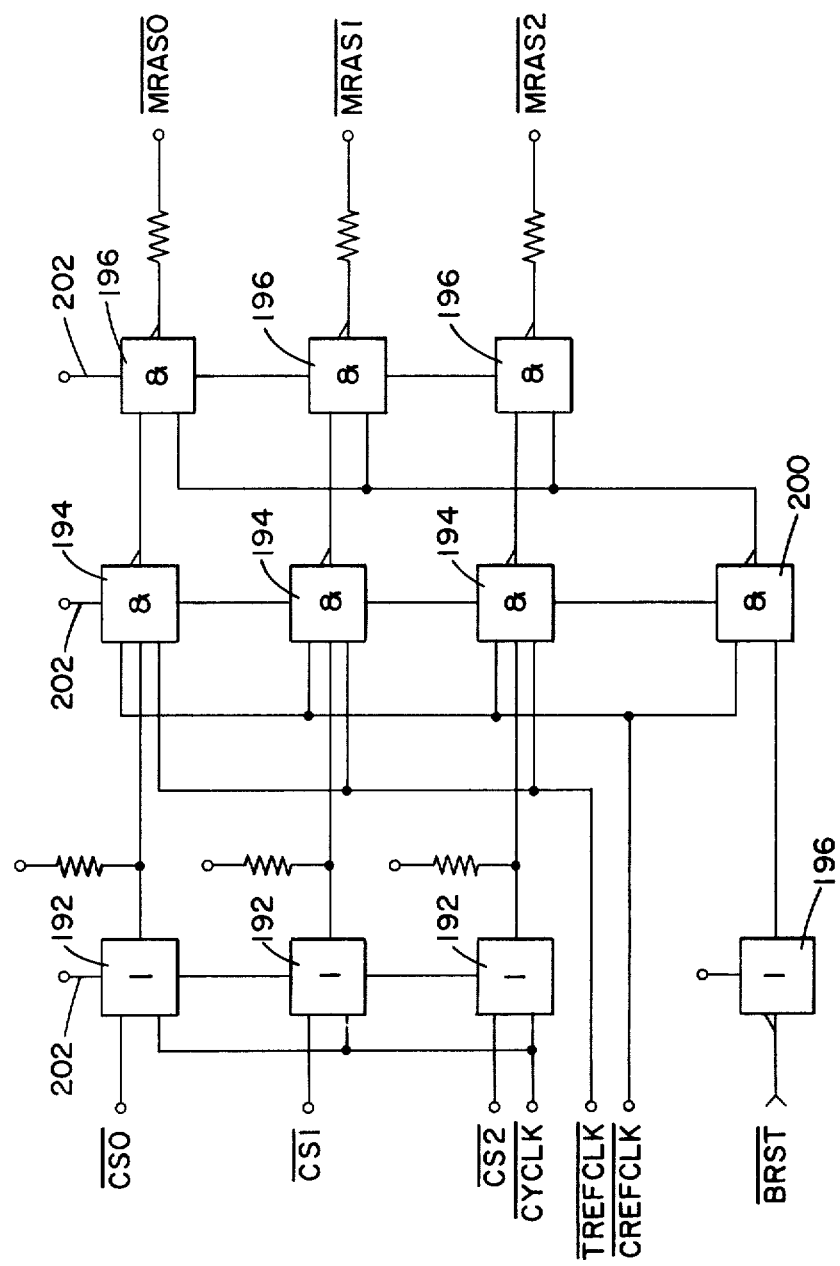
FIG. 6 is a detailed schematic diagram of the logic circuitry for generating row address strobes during a power up or power down condition of the memory system.

Referring now to FIG. 6, there is shown the circuitry located in the memory select circuit 42 (FIG. 1) which provides the memory row address strobes $\overline{MRAS0}$-$\overline{MRAS2}$ inclusive for a number of banks in the RAM memory 28 (FIG. 1A). The RAM memory 28 comprises three 16K memory banks, each of which is strobed by one of the $\overline{MRAS0\text{-}2}$ signals (FIG. 6). Included in the circuit is a logic array of OR gates 192, a first set of NAND gates 194 and a second set of NAND gates 196. Each of the OR gates 192 has one input coupled to one of a number of select lines CS0–CS2 inclusive coming from a decoder (not shown) located in the memory select circuit 42 (FIG. 1A). Whenever one of the select lines CS0–CS2 inclusive becomes active low during a memory request cycle, the signal will be transmitted through its corresponding OR gates 192 upon the occurrence of a cycle clock pulse $\overline{CYCLK}$ (FIG. 2), the selected OR gates 192 outputting a low signal to its corresponding AND gate 194 whose other input contains a transparent refresh clock signal $\overline{TREFCLK}$ (FIG. 3) and contention refresh clock signal $\overline{CREFCLK}$ (FIG. 5), both of which at this time are high. With these signals present, the NAND gate 194 will output a high signal to an associated NAND gate 196 whose other input is high at this time. The selected NAND gate 196 will output the active low memory row address strobe $\overline{MRAS0}$ for its associated bank in the RAM memory 28 enabling an access to occur in that bank of the memory 28. When a refresh operation occurs, entry of the refresh clocks $\overline{TREFCLK}$ and $\overline{CREFCLK}$ will be active low enabling each of the NAND gates 194 to output a high signal, which coupled with the low output signal from the OR gate 192 will output active low $\overline{MRAS0}$-$\overline{MRAS2}$ inclusive signals enabling the refreshing of the rows of the RAM memory 28 to occur simultaneously during a transparent or contention refresh operation.

Since the reset signal $\overline{BRST}$ will be active low during a power up or a power down condition, the NAND gates 196 will be enabled by the active low $\overline{BRST}$ signal to output the $\overline{MRAS0}$-$\overline{MRAS2}$ signals until a refresh cycle is completed. This condition is accomplished since each of the gates 192–196 inclusive are coupled over line 202 to the power down driver 50 (FIG. 1B) and thereby battery-supported enabling the gates to continue operation until the refresh cycle is completed. This condition is necessary in order not to shorten the $\overline{MRAS}$ signals which could occur if a power failure occurred during the generation of the signals. Shortening of the $\overline{MRAS}$ signals could conceivably result in the loss of data stored in the RAM memory 28.

While there has been described a preferred form of the invention and its mode of operation, it will be apparent to those skilled in the art that changes may be made in the circuits described without departing from the spirit and scope of the invention as set forth in the appended claims, and that in some cases certain features of the invention may be used to advantage or modified without corresponding changes in other features while certain features may be substituted for or eliminated as appreciated by those skilled in the art. Therefore, the instant invention is not to be restricted beyond that as required by the following claims.

What is claimed is:

1. A system for controlling the refresh operation of a dynamic memory unit connected to a processing unit which generates memory access signals comprising:
   a. means for refreshing the dynamic memory unit;
   b. means for generating first periodic refresh control signals;
   c. means operatively coupled to said memory unit for selecting and enabling either of said refreshing means or said processing unit access to said memory unit in response to the generation of said memory access signal or said first periodic refresh control signals;
   d. means for operating said selecting means to enable said processing unit and said refreshing means access to said memory unit in accordance with the first of said signals generated, said operating means generating a first control signal upon completion of the access operation;
   e. and means responsive to the simultaneous generation of said first periodic refresh control signals and said access signal for disabling said processing unit when said selecting means is operated to give said refreshing means access to said memory unit and operating said selecting means to give said processing unit access to the memory unit in response to the generation of said first control signal.

2. The system of claim 1 in which said operating means includes a first circuit means responsive to the generation of said memory access and refresh control signals to output said first control signal and a second control signal to said selecting means thereby enabling said refreshing means access to said memory unit after a memory access operation has occurred upon receiving the memory access signal prior to the generation of the refresh control signals.

3. The system of claim 2 in which said system further includes second circuit means receiving said memory access and refresh control signals, said second circuit means outputting a third control signal to said first circuit means in response to the simultaneous generation of said memory access and refresh signals enabling said first circuit means to provide a memory access operation after the completion of the refresh operation.

4. The system of claim 3 which further includes third circuit means receiving said memory access and refresh control signals to output a fourth control signal to said processing unit to disable the processing unit from accessing the memory unit upon receiving the refresh control signals prior to the generation of the memory access signals.

5. The system of claim 4 in which the processing unit generates second periodic refresh control signals for enabling said refreshing means to refresh said memory unit, said system further including fourth circuit means coupled to said processing unit and said first circuit means for outputting a fifth control signal to said refreshing means enabling said refreshing means to refresh the memory unit at the completion of a memory access operation in response to receiving said second refresh control signals and said first control signals from said first circuit means upon the completion of a memory access operation.

6. The system of claim 5 in which the processing unit generates a sixth control signal upon the occurrence of a power loss in the system, said system further including a power source which operates independently of the system and said refreshing means includes fifth circuit means coupled to the processing unit and the power supply, said fifth circuit means enabled by the generation of said sixth control signal to couple said power source to said fifth circuit means enabling said refreshing means to refresh the memory unit upon the occurrence of a system power failure.

7. The system of claim 1 in which said first periodic signal generating means includes:
   a. a source of clock pulses;
   b. means for counting said clock pulses to output a plurality of seventh control signals upon reaching a predetermined count;
   c. and sixth circuit means coupled to the output of said counting means for generating said first periodic refresh control signals in response to receiving said sixth control signals.

8. A circuit for controlling the refresh operation of a dynamic memory unit coupled to a processor in which said processor generates memory access signals to perform a read or write operation in the memory unit, first periodic refresh control signals for refreshing the memory unit and a reset signal in response to a loss of power in the memory unit, said circuit comprising:

first circuit means for generating second periodic refresh control signals;

second circuit means for refreshing said dynamic memory unit in response to the generation of said first and second refresh control signals;

means operatively connected to said memory unit for selectively enabling either of said processor or said second circuit means access to said memory unit in response to the generation of said memory access signals and said first and second periodic refresh control signals;

third circuit means responsive to the generation of said memory access signal and said second refresh control signals to output a plurality of first control signals to said selecting means enabling said selecting means to provide the processor or said second circuit means access to the memory unit in accordance with the first of said memory access and second refresh signals generated, said third circuit means generating a second control signal at the completion of the access operation;

and fourth circuit means responsive to the simultaneous generation of said memory access signals and said second refresh control signals for outputting to said processor a third control signal disabling said processor from accessing the memory unit when access to the memory unit is awarded to said second circuit means, said fourth circuit means further responsive to the generation of said second control signal for enabling said processor to access the memory unit at the completion of the refresh operation.

9. The refresh controlling circuit of claim 8 in which said third circuit means includes a first bi-stable means for defining one of a plurality of system states, said bi-stable means coupled to said first circuit means and said processor for receiving said memory access and refresh control signals, said bi-stable means being switched to a first state by said memory access signal when generated before the second refresh control signals enabling a refresh operation to occur after a memory access operation is completed.

10. The refresh controlling circuit of claim 9 in which said first bi-stable means is switched to a second state by said second refresh control signals when generated prior to said memory access signals wherein said second circuit means is enabled to refresh the memory unit and said fourth circuit means includes a second bi-stable means for defining one of a plurality of system states coupled to said first circuit means and said processor for receiving said memory access and refresh control signals, said second bi-stable means being switched to a first state by said second refresh control signals when generated prior to the memory access signals to output a fourth control signal to said first bi-stable means switching said first bi-stable means to said first state at the conclusion of the refresh operation to initiate a memory access operation of the memory unit.

11. The refresh controlling circuit of claim 10 in which said fourth circuit means further includes gate means coupled to said processor and said second bi-stable means and adapted to generate a fifth control signal disabling the processor from accessing the memory unit when said second bi-stable means is switched to said first state.

12. The refresh controlling circuit of claim 9 which includes logic means coupled to the processor and said third circuit means, said logic means enabled by signals generated by said third circuit means at the completion of a memory access operation and said first periodic refresh control signals to output a first clock signal to said second circuit means enabling said second circuit means to refresh the dynamic memory at the completion of a memory access operation.

13. The circuit of claim 12 which further includes a battery-powered power supply and said second circuit means includes first gating means each coupled to said power supply, said gating means further coupled to said logic means and said first circuit means and enabled upon the generation of either of said first clock signal or said periodic refresh control signals to output enabling signals to the memory unit for refreshing the memory unit.

14. The circuit of claim 13 in which said second circuit means further includes second gating means coupled to the processor and each of said first gating means, said second gating means enabled by the generation of the reset signal to output a sixth control signal to each of said second gating means enabling the battery-supported second gating means to output the enabling signals to the memory unit for refreshing the memory unit after a loss of power in the memory unit has occurred.

* * * * *